(12) United States Patent
Niitsu et al.

(10) Patent No.: US 9,340,041 B2
(45) Date of Patent: May 17, 2016

(54) DRYING DEVICE AND IMAGE FORMING APPARATUS

(71) Applicant: FUJI XEROX CO., LTD., Tokyo (JP)

(72) Inventors: Takehiro Niitsu, Kanagawa (JP); Jun Isozaki, Kanagawa (JP); Yasuhiro Ogasawara, Kanagawa (JP); Hiroyuki Tsukuni, Kanagawa (JP); Akira Sakamoto, Kanagawa (JP); Naoki Morita, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/605,060

(22) Filed: Jan. 26, 2015

(65) Prior Publication Data

US 2016/0059583 A1 Mar. 3, 2016

(30) Foreign Application Priority Data

Sep. 2, 2014 (JP) ................................. 2014-178080

(51) Int. Cl.
| | |
|---|---|
| *B41J 11/00* | (2006.01) |
| *H01L 23/528* | (2006.01) |
| *H01L 23/538* | (2006.01) |
| *H01S 5/183* | (2006.01) |

(52) U.S. Cl.
CPC ........... *B41J 11/002* (2013.01); *H01L 23/5286* (2013.01); *H01L 23/5386* (2013.01); *H01S 5/183* (2013.01)

(58) Field of Classification Search
CPC ............. H01L 23/5286; H01L 23/5386; B41J 11/002; H01S 5/183
See application file for complete search history.

(56) References Cited

U.S. PATENT DOCUMENTS

| | | | |
|---|---|---|---|
| 2009/0021560 A1 | 1/2009 | Miura | |
| 2013/0056759 A1* | 3/2013 | Wu et al. | 257/88 |
| 2014/0210880 A1* | 7/2014 | Edlitz et al. | 347/5 |
| 2015/0110140 A1* | 4/2015 | Letsch et al. | 372/38.1 |

FOREIGN PATENT DOCUMENTS

| | | |
|---|---|---|
| JP | 2006-239508 | 9/2006 |
| JP | 2009-022831 | 2/2009 |

OTHER PUBLICATIONS

Abstract and machine translation of JP 2006-239508.
Abstract and machine translation of JP 2009-022831.

* cited by examiner

*Primary Examiner* — Kristal Feggins
*Assistant Examiner* — Kendrick Liu
(74) *Attorney, Agent, or Firm* — Fildea & Outland, P.C.

(57) ABSTRACT

There is provided a drying device including a plurality of surface-emitting laser elements each having a plurality of laser elements and arranged along a feeding direction of a recording medium. First power supplying pads are respectively provided at both ends of an electrode on a laser illumination surface of each surface-emitting laser element in a width direction of the recording medium and a second power supplying pad is provided at one end of the electrode on a backside of each surface-emitting laser element in the feeding direction. The respective first power supplying pads of the surface-emitting laser element arranged at an upstream-side in the feeding direction and the second power supplying pad of the surface-emitting laser element arranged at a downstream-side in the feeding direction are connected to each other by wires.

6 Claims, 9 Drawing Sheets

SHEET FEEDING DIRECTION

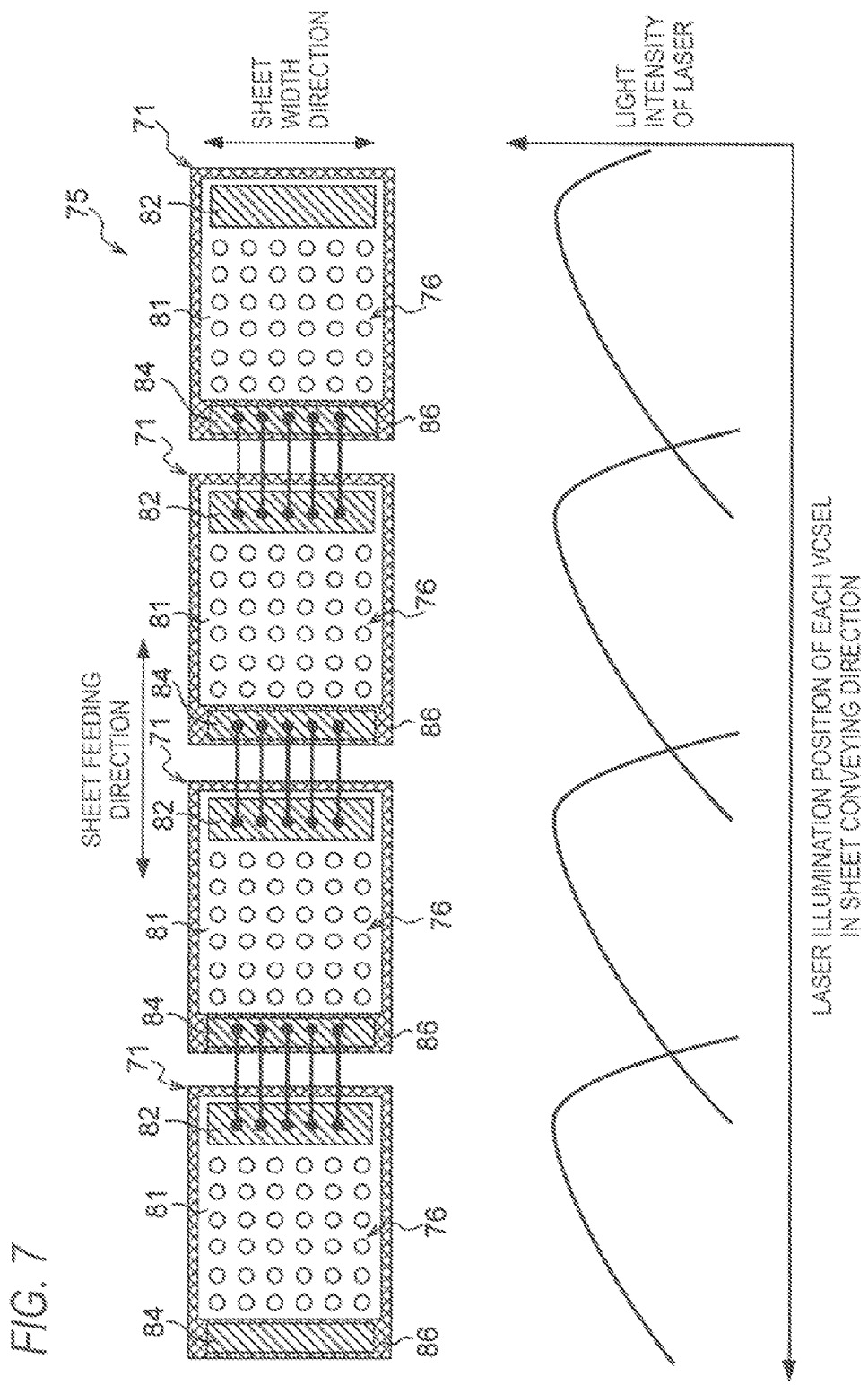

FIG. 8
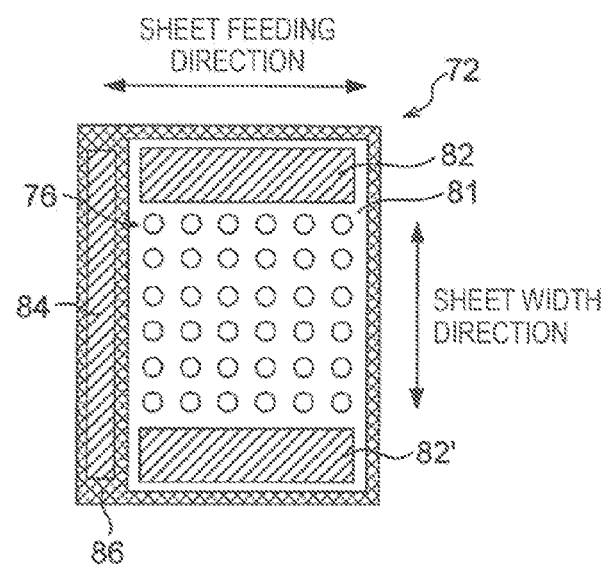
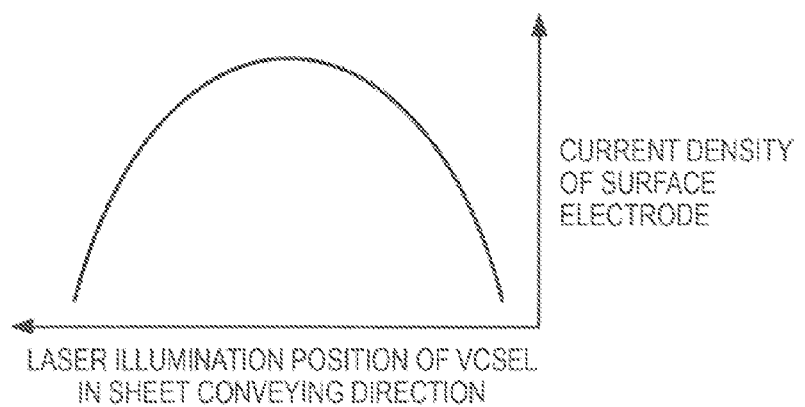

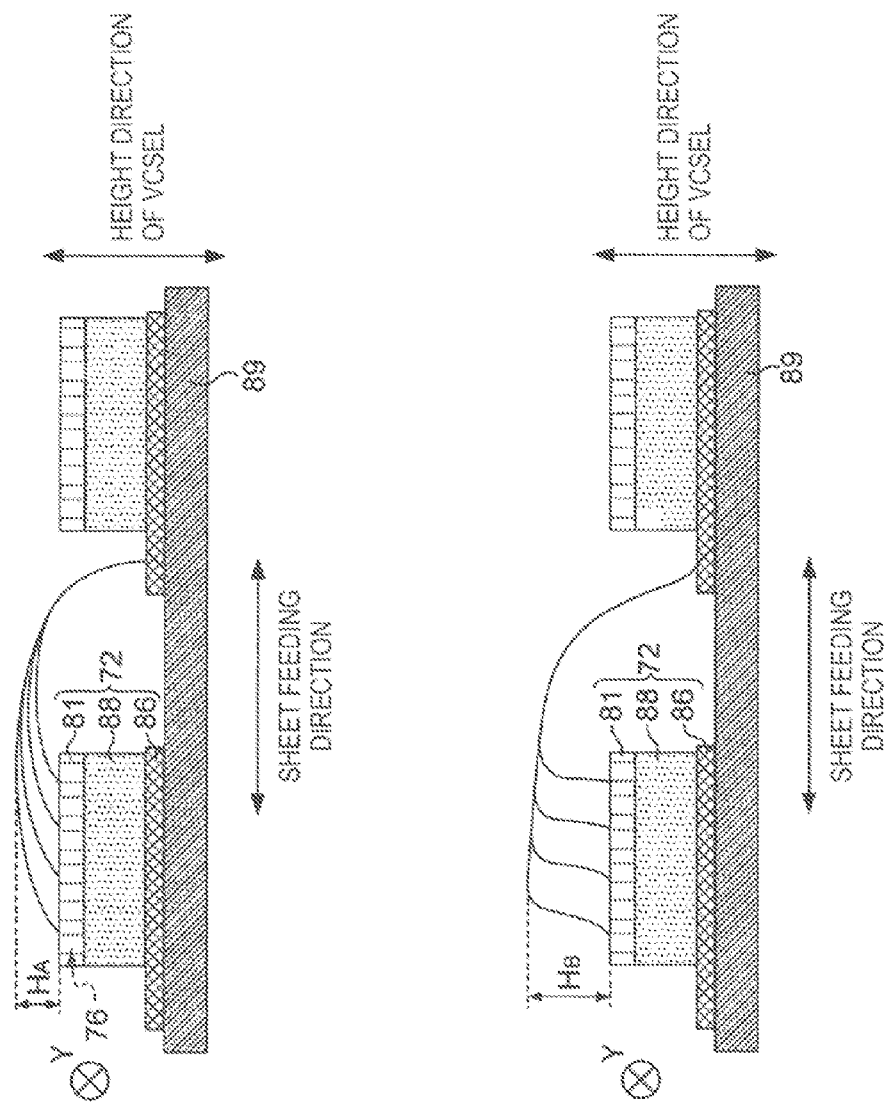

DRYING DEVICE AND IMAGE FORMING APPARATUS

CROSS-REFERENCE TO RELATED APPLICATIONS

This application is based on and claims priority under 35 U.S.C. §119 from Japanese Patent Application No. 2014-178080 filed on Sep. 2, 2014.

TECHNICAL FIELD

The present invention, relates to a drying device and an image forming apparatus.

SUMMARY

According to an aspect of the exemplary embodiments of the present invention, there is provided a drying device comprising a plurality of surface-emitting laser elements each having a plurality of laser elements and arranged along a feeding direction of a recording medium, wherein each of the surface-emitting laser elements has electrodes arranged on a laser illumination surface and a backside which is an opposite surface of the laser illumination surface, respectively, wherein first power supplying pads are respectively provided at both ends of the electrode on the laser illumination surface in a width direction of the recording medium intersecting with the feeding direction of the recording medium and a second power supplying pad is provided at one end of the electrode on the backside in the feeding direction of the recording medium, and wherein the respective first power supplying pads of the surface-emitting laser element arranged at an upstream-side with respect to the feeding direction of the recording medium and the second power supplying pad of the surface-emitting laser element arranged at a downstream-side with respect to the feeding direction of the recording medium are connected to each other by wires.

BRIEF DESCRIPTION OF THE DRAWINGS

Exemplary embodiments of the present invention will be described in detailed based on the following figures, wherein:

FIG. 7 illustrates an example of the light intensity distribution of the laser when the side power supplying type VCSEL is connected;

FIG. 8 illustrates an example of a light intensity distribution of laserby a both-side power supplying type VCSEL;

FIG. 10 illustrates a connection example of bonding wires;

FIG. 11 illustrates a connection example of the bonding wires; and

DETAILED DESCRIPTION

Figure 1:
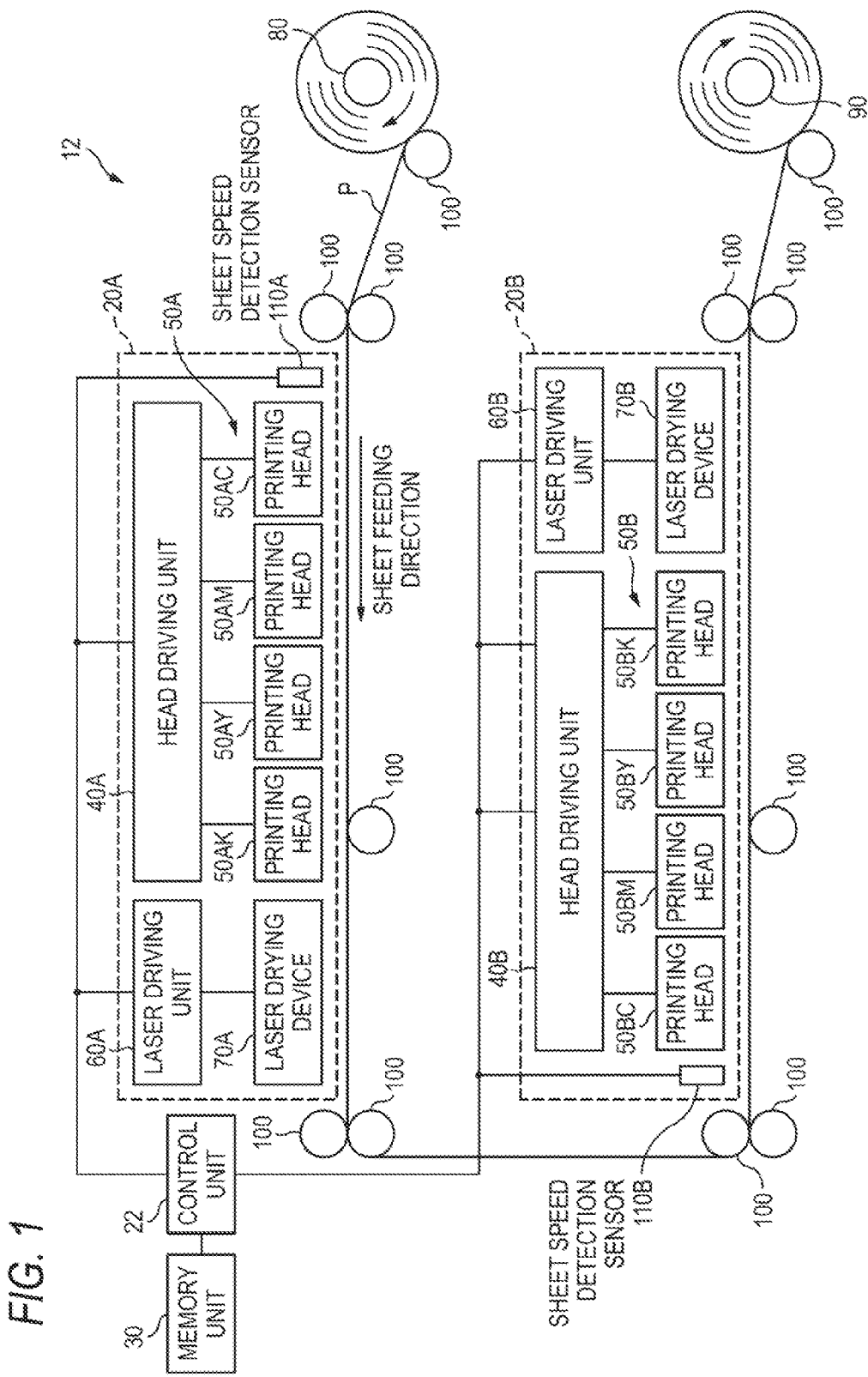
FIG. 1 is a schematic configuration view illustrating an example of main constitutional parts of an inkjet printing apparatus.

Hereinafter, an illustrative embodiment of the present invention will be described with reference to the drawings. Meanwhile, the constitutional elements having the same operation are denoted with the same reference numerals in the drawings, and the overlapping descriptions are appropriately omitted.

FIG. 1 is a schematic configuration view illustrating an example of main constitutional parts of an inkjet printing apparatus 12 according to an illustrative embodiment.

The inkjet printing apparatus 12 includes two image forming units 20A, 20B, a control unit 22, a memory unit 30, a feed roller 80, a rewind roller 90 and conveyance rollers 100, for example.

Also, the image forming unit 20A includes a head driving unit 40A, a printing head 50A, a laser driving unit 60A, a laser drying device 70A and a sheet speed detection sensor 110A, for example. Likewise, the image forming unit 20B includes a head driving unit 40B, a printing head 50B, a laser driving unit 60B, a laser drying device 70B and a sheet speed detection sensor 110B, for example, which are common members to the image forming unit 20A.

In the below, when it is not necessary to distinguish the image forming units 20A, 20B and the common members included in the image forming units 20A, 20B, the descriptions are made with the last symbol 'A' and 'B' being omitted.

The control unit 22 is configured to drive a sheet conveying motor (not shown) to control rotations of the conveyance rollers 100 coupled to the sheet conveying motor through a mechanism such as gears, for example. The feed roller 80 is wound thereon with a continuous sheet P, which is an example of the recording medium and is long in a sheet feeding direction. As the conveyance rollers 100 are rotated, the continuous sheet P is conveyed in the sheet feeding direction.

The control unit 22 is configured to acquire image information stored in the memory unit 30 and to control the image forming unit 20A on the basis of color information for each pixel of an image included in the image information, thereby forming an image corresponding to the image information on one image formation surface of the continuous sheet P.

Specifically, the control unit 22 is con figured to control the head driving unit 40A. The head driving unit 40A is configured to drive the printing head 50A coupled to the head driving unit 40A in accordance with ejection timing of ink droplets instructed from the control unit 22, to eject ink droplets from the printing head 50A and to form an image corresponding to the image information on one image formation surface of the continuous sheet P being conveyed.

In the meantime, the color information for each pixel of an image included in the image information includes information uniquely indicating a color of a pixel. In this illustrative embodiment, the color information for each pixel of an image is expressed by a density of each to of yellow (Y), magenta (M), can (C) and black (B), for example. However, the other expression methods of uniquely indicating a color of an image may also be used.

The printing head 50A includes four printing head 50AY, 50AM, 50AC, 50AK corresponding to four colors of yellow (y), magenta (M), can (C) and black (B), respectively, and the ink droplets of corresponding colors are ejected from the printing head 50A. In the meantime, a driving method for ejecting the ink droplets from the printing head 50A is not particularly limited, and a well-known method such as a so-called thermal method, a piezoelectric method and the like is used.

The laser driving unit 60A includes a switching element such as a FET (Field Effect Transistor) for controlling on and off of laser elements included in the laser drying device 70A, and is configured to drive the switching element on the basis of an instruction from the control unit 22.

The control unit 22 is configured to control the laser driving unit 60A, thereby illuminating the laser from the laser drying device 70A towards the one image formation surface of the continuous sheet P to dry the image ink droplets formed on the continuous sheet P and to fix the image on the continuous sheet P. The control unit 22 can improve drying efficiency by controlling on and off or strength of the laser illumination on the basis of the image information.

In the meantime, a distance from the laser drying device 70A to the continuous sheet P is set on the basis of an emission angle of the laser element and an area of an emission range thereof.

Thereafter, the continuous sheet P is conveyed to a position facing the image forming unit 20B as the conveyance rollers 100 are rotated. At this time, the continuous sheet P is conveyed so that the other image formation surface other than the image formation surface having the image formed thereon by the image forming unit 20A faces the image forming unit 20B.

The control unit 22 performs the same control as the control for the image forming unit 20A for the image forming unit 20B, thereby forming an image corresponding to the image information on the other image formation surface of the continuous sheet P. Like this, the inkjet priming apparatus 12 includes the two image forming units 20A, 20B so as to cope with the duplex printing of the continuous sheet P.

The continuous sheet P is fed to the rewind roller 90 as the feed rollers 100 are rotated and is then wound on the rewind roller 90.

The sheet speed detection sensor 110 is disposed at a position at which it faces the image formation surface of the continuous sheet P, for example, and is configured to detect a feeding speed of the continuous sheet P in the sheet feeding direction and to notify the control unit 22 of the detected feeding speed.

The control unit 22 is configured to control a driving timing of the laser driving unit 60 by using the feeding speed of the continuous sheet P acquired from the Sheet speed detection sensor 110 so that the laser is illuminated from the laser drying device 70 to the continuous sheet P at timing at which the ink droplets ejected to the continuous sheet P are conveyed to a laser illumination region of the laser drying device 70.

A method for detecting the feeding speed of the continuous sheet P in the sheet speed detection sensor 110 is not particularly limited, and a well-known method is applied. In the meantime, the sheet speed detection sensor 110 is not a member that should be necessarily provided for the inkjet printing apparatus 12 of this illustrative embodiment.

Also, the ink includes oil-based ink from which solvent is evaporated, ultraviolet cure ink and the like. In this illustrative embodiment, however, aqueous ink is used. In this illustrative embodiment, when simply describing 'ink' or 'ink droplet', it means 'aqueous ink' or 'aqueous ink droplet'.

Figure 2:
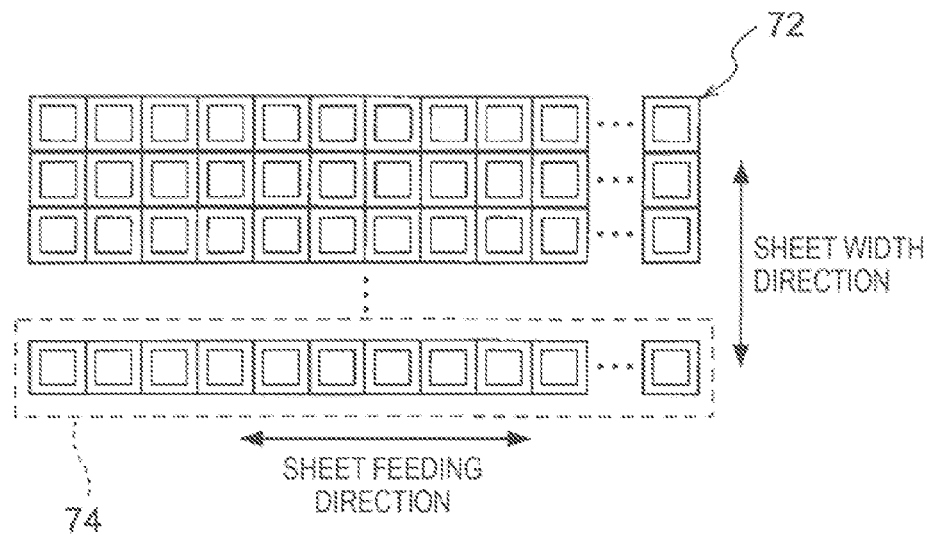
FIG. 2 illustrates an example of a laser illumination surface of a laser drying device.

FIG. 2 illustrates an example of a laser illumination surface of the laser drying device 70. In the meantime, the laser illumination surface of the laser drying device 70 means a surface facing the image formation surface of the continuous sheet P.

As shown in FIG. 2, a plurality of surface-emitting laser elements 72 is arranged in a lattice shape on the laser illumination surface of the laser drying device 70 in the sheet feeding direction and in a sheet width direction orthogonal to the sheet feeding direction. The laser illumination timing is controlled by the laser driving unit 60 for each laser block 74 including the plurality of surface-emitting laser elements 72 arranged in a line in the sheet feeding direction. In the meantime, the driving unit by the laser driving unit 60 is just exemplary. For example, the laser driving unit 60 may be configured to drive each of the surface-emitting laser elements 72.

Here, the surface-emitting laser element 72 is a laser element including a vertical resonator laser element in which a plurality of laser elements is arranged in a lattice shape in the sheet feeding direction and in the sheet width direction, and is also called as a VCSEL (Vertical Cavity Surface Emitting Laser). In the meantime, the number and arrangement shape of the VCSELs 72 arranged on the laser illumination surface of the laser drying, device 70 shown in FIG. 2 are just exemplary.

Figure 3:
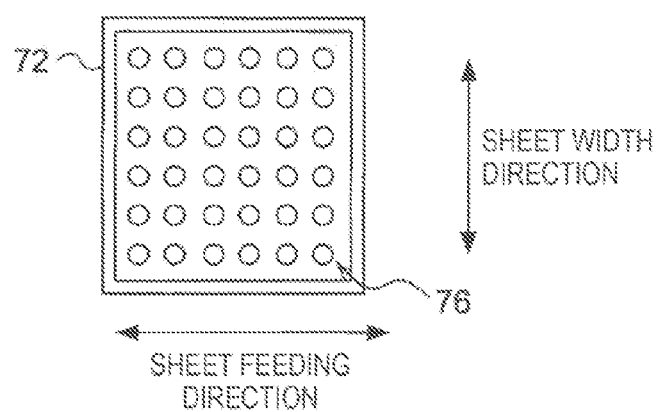
FIG. 3 illustrates an example of a laser illumination surface of a VCSEL.

FIG. 3 illustrates an example of a laser illumination surface of the VCSEL 72 shown in FIG. 2. In the meantime, the laser illumination surface of the VCSEL 72 means a surface facing the image formation surface of the continuous sheet P, like the laser illumination surface of the laser drying device 70.

As described above, a plurality of laser elements 76 is arranged in a lattice shape in the sheet feeding direction and in the sheet width direction on the laser illumination surface of the VCSEL 72, and the laser is illuminated from each laser element 76 at timing corresponding to the on and off control of the VCSEL 72. In the meantime, the number and arrangement shape of the laser elements 76 arranged in the VCSEL 72 shown in FIG. 3 are just exemplary.

Subsequently, a relation between the ink droplets ejected to the continuous sheet P and a laser illumination range of the VCSEL 72 is described.

Figure 4:
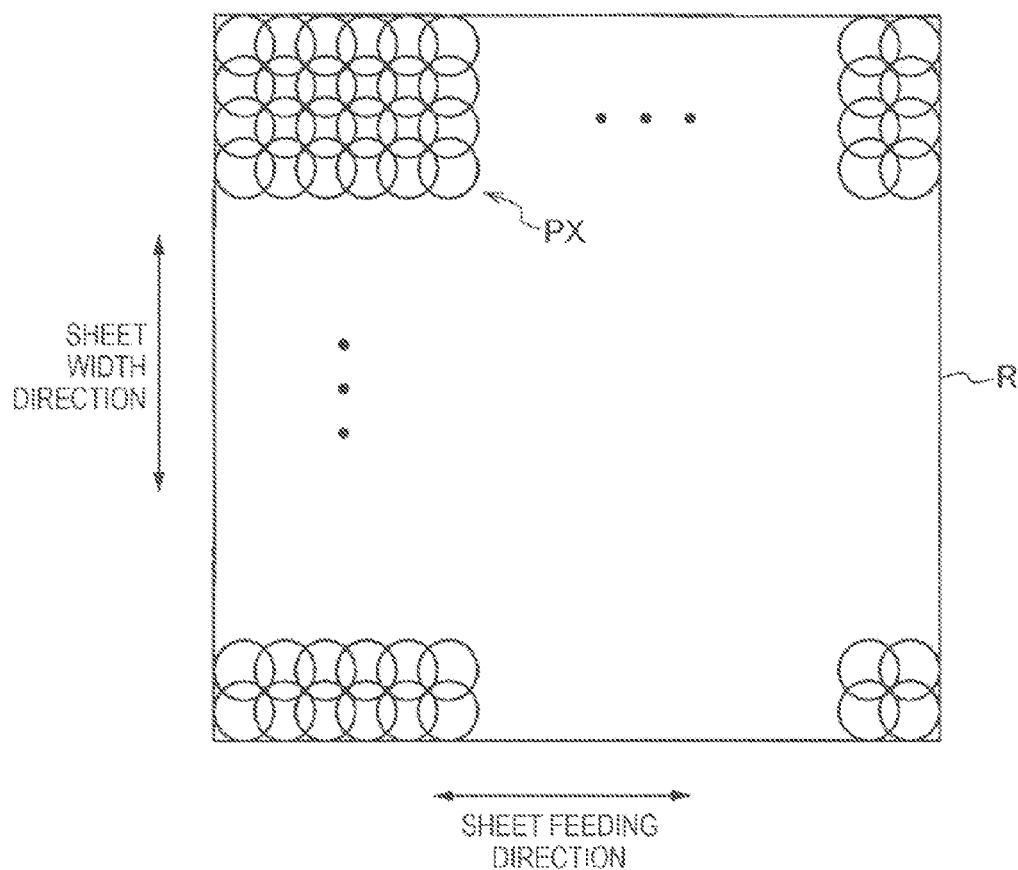
FIG. 4 illustrates an example of a laser illumination range of the VCSEL.

FIG. 4 illustrates a laser illumination range R of the VCSEL 72.

As shown in FIG. 4, according to the laser drying device 70 of this illustrative embodiment, the laser illumination range R of the VCSEL 72 is set so that a plurality of ink droplets PX is included in the laser illumination range R of one VCSEL 72. For example, when a printing resolution of the printing head 50 is 1,200 dpi (dots per inch), a range including 60 ink droplets PX in the sheet feeding direction and 60 ink droplets PX in the sheet width direction is set as the laser illumination range R. In this case, the laser illumination range R is expressed by a rectangle having a length of 1.27 mm in the sheet feeding direction and a length of 1.27 mm in the sheet width direction. Like this, each VCSEL 72 is configured to dry the plurality of ink droplets PX.

Subsequently, a structure of a VCSEL 71 of the related art is described in detail with reference to FIG. 5.

Figure 5:
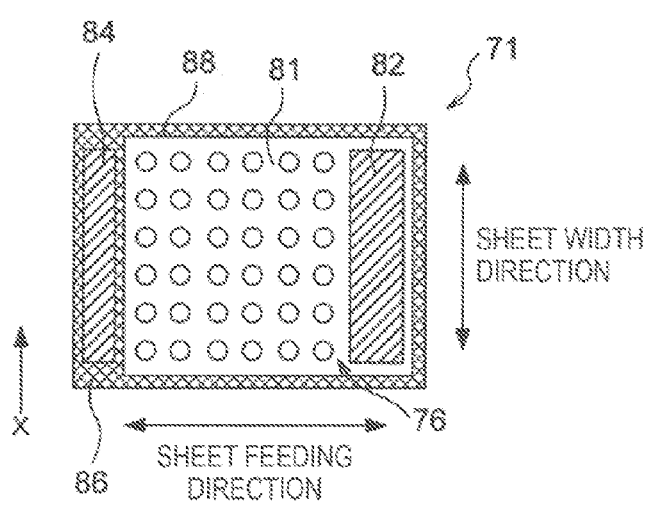
FIG. 5 is a pictorial view illustrating a structure of a one-side power supplying type VCSEL.

FIG. 5 illustrates the VCSEL 71, as seen towards as laser illumination surface thereof. The VCSEL 71 has a rectangular electrode provided over an entire surface of a laser illumination surface of a chip main body 88 and a rectangular electrode electrically bonded on a backside of the chip main body 88, which is an opposite surface to the laser illumination surface of the chip main body 88, a substrate mounting surface, and provided on a substrate 89. In the below, the electrode provided over the entire surface of the laser illumination surface of the chip main body 88 is referred to as a surface electrode 81 and the electrode bonded on the backside of the chip main body 88 and provided on the substrate 89 is referred to as a backside electrode 86. The chip main body 88 and the backside electrode 86 are bonded to each other by a conductive adhesive, a gold-tin soldering and the like. In the meantime, when describing the VCSEL 71 hereinafter, it is assumed that the VCSEL 71 includes the chip main body 88, the surface electrode 81 and the backside electrode 86 (this is also the same for the VCSEL 72, which will be described later).

The surface electrode 81 of the VCSEL 71 functions as an anode electrode and the backside electrode 86 functions as a cathode electrode. However, the surface electrode 81 may be configured as a cathode electrode and the backside electrode 86 may be configured as an anode electrode.

Further, a bonding pad 82 for connecting a bonding wire is provided at one end of the surface electrode 81.

In the meantime, the backside electrode 86 of the VCSEL 71 is formed to be larger than the chip main body 88 of the VCSEL 71 having the laser elements 76 and wirings of the laser elements 76 embedded therein, when the VCSEL 71 is seen towards the laser illumination surface. A bonding pad 84 for connecting a bonding wire is provided at a position at which it does not overlap with the chip main body 88. The power is supplied to the VCSEL 71 via the bonding pads 82, 84. Therefore, in the below, the bonding pads 82, 84 are referred to as power supplying pads 82, 84. Also, the 'bonding wire' is referred to as 'wire'.

In the meantime, the power supplying pad 82 is a region of the surface electrode 81, to which the bonding wire is connected. Also, the power supplying pad 84 is a region of the backside electrode 86, to which the bonding wire is connected. In FIG. 5, the rectangles indicating the power supplying pads 82, 84 are shown on the surface electrode 81 and the backside electrode 86 for convenience of explanations. Actually, boundary lines indicating boundaries of the power supplying pads 82, 84 may not be provided on the surface electrode 81 and the backside electrode 86.

In the meantime, like the VCSEL 71 shown in FIG. 5, a method of feeding the power from the power supplying pad 82 incorporated at one place on the surface electrode 81 is referred to as one-side power supplying method.

Figure 6A:
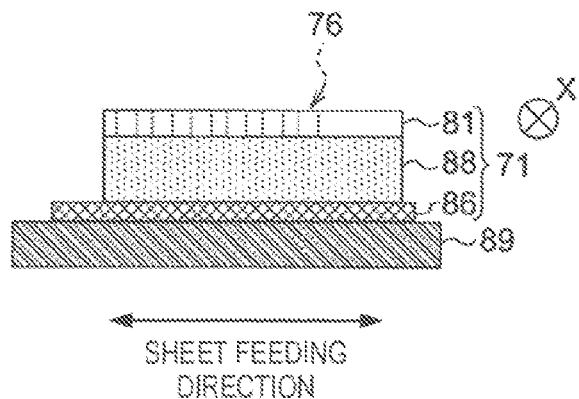
FIGS. 6A to 6C illustrate an example of a light intensity distribution of laserby the one-side power supplying type VCSEL.
Figure 6B:
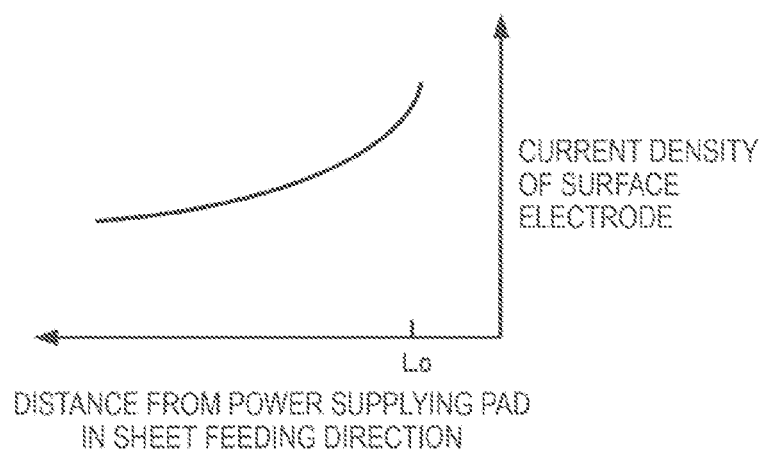
Figure 6C:
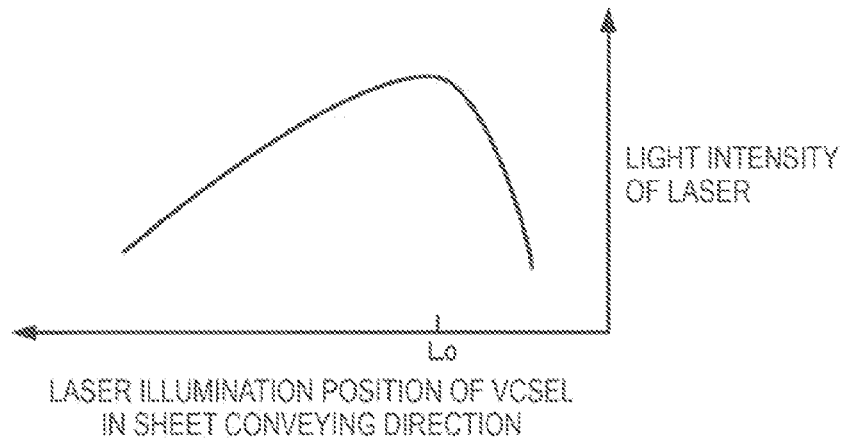

FIGS. 6A to 6C illustrate a light intensity distribution by the one-side power supplying type VCSEL 71.

First, FIG. 6A pictorially illustrates the VCSEL 71 of FIG. 5, as seen in an X direction. The VCSEL 71 is mounted on the substrate 89.

Also, FIG. 6B is a graph showing a relation between a distance of the surface electrode 81 from the power supplying pad 82 in the sheet feeding direction and a current density of the surface electrode 81. When a connection point position of the power supplying pad 82 with the wire in the sheet feeding direction is denoted with L0, since the power is supplied through the wire, the current density of the surface electrode 81 is greatest at the position L0 and decreases as the distance of the surface electrode 81 from the power supplying pad 82 increases, as shown in FIG. 6B.

The reason is described. In case of the one-side power supplying type VCSEL 71, the current density of the surface electrode 81 more distant front the power supplying pad 82 tends to decrease due to an influence of a wiring resistance of the surface electrode 81.

Therefore, as shown in FIG. 6C, a illuminace distribution of the one-side power supplying type VCSEL 71, which is obtained when a horizontal axis is set as a laser illumination position of the VCSEL 71 in the sheet feeding direction and a vertical axis is set as a light intensity of the laser, is asymmetric with respect to the sheet feeding direction. That is, a light intensity of the laser element 76 arranged at a more distant position from the power supplying pad 82 in the sheet feeding direction is less than a light intensity of the laser element 76 arranged at a closer position to the power supplying pad 82.

FIG. 7 illustrates an example of a light intensity distribution in the sheet feeding direction, which is obtained when a plurality of one-side power supplying type VCSELs 71 included in a laser block 75 is connected in series and the laser is illuminated from each VCSEL 71.

As shown in FIG. 7, when connecting the VCSELs 71 in series, it is possible to arrange the one-side power supplying type VCSELs 71 so that the power supplying pad 82 of the surface electrode 81 and the power supplying pad 84 of the backside electrode 86 are close to each other. Therefore, even when the power supplying pad 82 and the power supplying pad 84 arranged to be close to each other are connected with the wires, since the wires do not pass over the laser illumination range R of the VCSEL 71, it is possible to easily connect the VCSELs 71 in series, as compared to a configuration where the power supplying pads 82, 84 are provided at positions at which the connected wires pass over the laser illumination range R of the VCSEL 71 and thus interrupt the laser illumination.

In the meantime, the number of wires for connecting the adjacent VCSELs 71 is changed depending on a relation between current flowing through the VCSEL 71 and allowable current enabled to flow through one wire.

However, as described above with reference to FIGS. 6A to 6C, the light intensity distribution of the one-side power supplying type VCSEL 71 is asymmetric with respect to the sheet feeding direction. That is, a light intensity distribution of the laser block 75, which is obtained when the one-side power supplying type VCSELs 71 are connected in series as shown in FIG. 7, has a shape obtained by summing the light intensity distributions of the respective VCSELs 71, which are asymmetric with respect to the sheet feeding direction, as shown in FIG. 7. Therefore, a deviation occurs in the light intensity distribution of the laser of the laser block 75 with respect to the sheet feeding direction. As a result, the light intensity of the laser in the sheet feeding direction may not fall in a predetermined range within which a light intensity of laser can be considered as uniform. Here, the predetermined range within which a light intensity of laser can be considered as uniform may be obtained by a laser illumination test using an actual laser drying device 70, a computer simulation and the like.

Therefore, both-side power supplying type VCSEL 72 is used in the laser drying device 70 of this illustrative embodiment.

FIG. 8 illustrates an example of a light intensity distribution of the both-side power supplying type VCSEL 72 in the sheet feeding direction. The VCSEL 72 is different from the one-side power supplying type VCSEL 71, in that power supplying pads 82, 82' are respectively provided at both opposite ends of the surface electrode 81 and the power supplying pad 84 is provided at one end of the backside electrode 86 orthogonal to both ends at which the power supplying pad 82 and the power supplying pad 82' are provided. In this way, since the VCSEL 72 has the two power supplying pads 82, 82' on the surface electrode 81, it is referred to as both-side power supplying type. In the meantime, the power supplying pads 82, 82' are an example of the first power supplying pad relating to the disclosed technology, and the power supplying pad 84 is an example of the second power supplying pad relating to the disclosed technology. Also, the power supplying pads 82, 82' have a shape of which a longitudinal direction is the sheet feeding direction, for example, and the power supplying pad 84 has a shape of which a longitudinal direction is the sheet width direction, for example.

In the both-side power supplying type VCSEL 72, since the electrical power is supplied from both ends of the surface electrode 81, the influence of the wiring resistance of the surface electrode 81 is cancelled, in contrast to the VCSEL 71. Therefore, when the VCSEL 72 is arranged so that the sheet feeding direction is the longitudinal direction of the power supplying pads 82, 82', an effect of suppressing lowering of the current density of the surface electrode 81 at as more distant position from the power supplying pads 82, 82' in the sheet width direction is expected.

That is, it is possible to expect an effect that the light intensity of the laser in the sheet width direction falls in a predetermined range within which the light intensity of the laser can be regarded as uniform.

Also, as shown in FIG. 8, a light intensity distribution of the VCSEL 72 in the sheet feeding direction is a symmetric distribution in which the light intensity of the laser is greatest at a central point of the surface electrode 81 in the sheet feeding direction, and forms a light intensity distribution conforming to a so-called Gaussian distribution. In the meantime, the reason why the light intensity by the VCSEL 72 is greatest at the central point of the surface electrode 81 in the sheet feeding direction is as follows: since one laser element 76 is surrounded by the other laser elements 76, a degree that the light intensity from the laser elements 76 overlap with each other increases.

Figure 9:
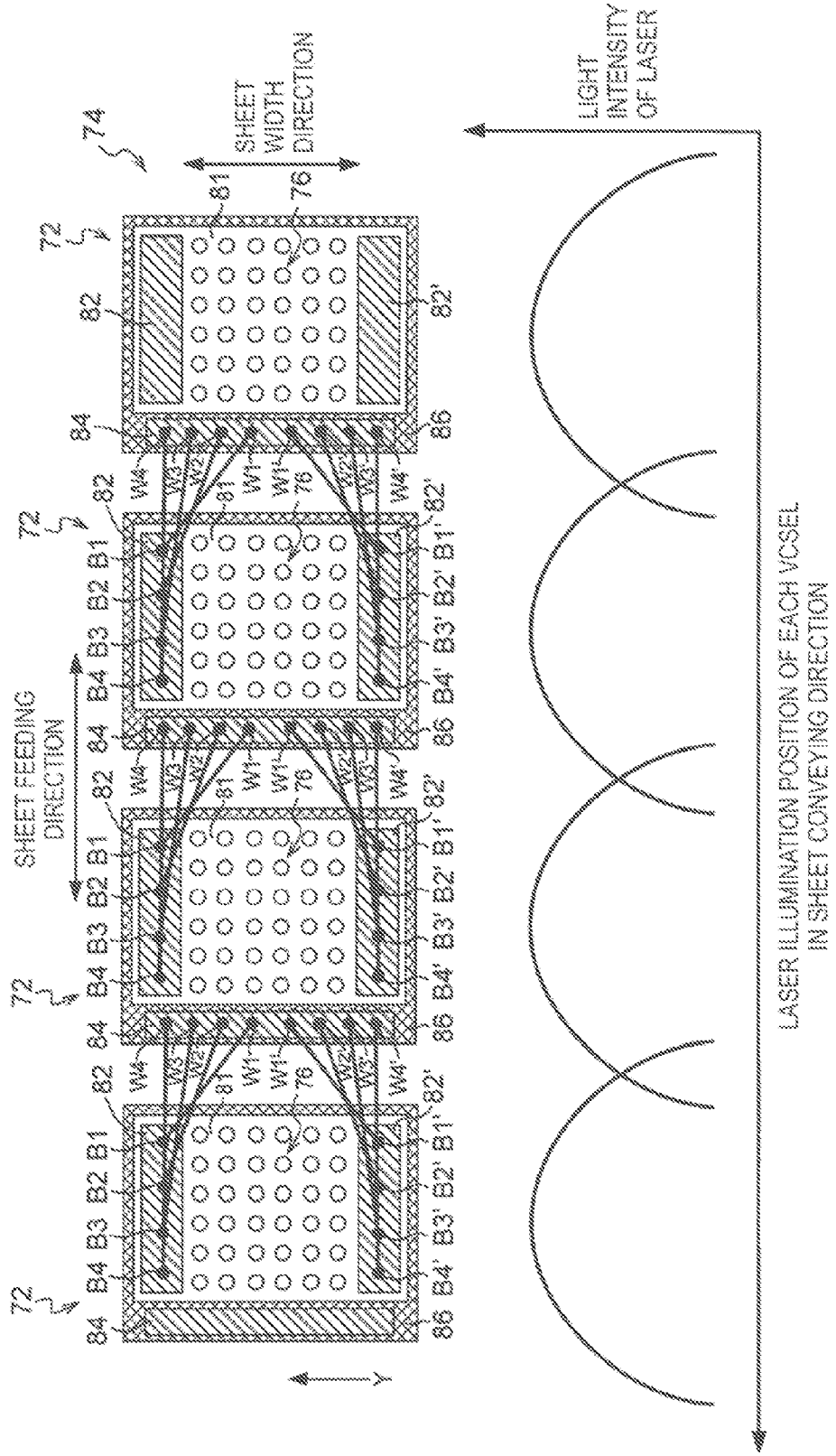
FIG. 9 illustrates an example of the light intensity distribution of the laser when the both-side power supplying type VCSEL is connected.

FIG. 9 illustrates an example of the light intensity distribution in the sheet feeding direction, which is obtained when the VCSEL 72 shown in FIG. 8 is arranged so that the longitudinal direction of the power supplying pads 82, 82' of the VCSEL 72 is the sheet feeding direction and then the plurality of VCSELs 72 is arranged in a line in the sheet feeding direction.

As shown in FIG. 9, according to the plurality of VCSELs 72 arranged in the sheet feeding direction, the power supplying pads 82, 82' of the VCSEL 72 and the power supplying pad 84 of the VCSEL 72, which is adjacent to the former VCSEL 72 and is positioned at a downstream side with respect to the sheet feeding direction, are connected to each other by the wires. Hereinafter, the VCSEL 72 positioned at the downstream side with respect to the sheet feeding direction is referred to a downstream-side VCSEL 72. Also, the VCSEL 72 that is adjacent to the noticed VCSEL 72 and positioned at an upstream side with respect to the sheet feeding direction is referred to as an upstream-side VCSEL 72.

In this case, as shown in FIG. 8, since the light intensity distribution of the VCSEL 72 in the sheet feeding direction conforms to the Gaussian distribution, a light intensity distribution of the laser block 74 in the sheet feeding direction is expressed by a sum of the Gaussian distributions.

In contrast to the one-side power supplying type VCSEL 71 shown in FIG. 7, since the light intensity distribution of the both-side power supplying type VCSEL 72 is symmetric in the sheet feeding direction, a part overlapping with the light intensity distribution of the adjacent VCSEL 72 is also symmetric. Therefore, it is possible to expect an effect that the light intensity by the laser block 74 in the sheet width direction falls in a predetermined range within which the light intensity of the laser can be regarded as uniform.

In the meantime, when the VCSELs 72 are arranged as shown in FIG. 9, the power supplying pads 82, 82' and the power supplying pad 84 are arranged to be orthogonal to each other. Therefore, if the power supplying pad 82 and the power supplying pad 84 are simply connected as shown in FIG. 7, the wires may pass over the laser illumination range R of the VCSEL 72 and thus interrupt the illumination of the laser.

Therefore, a connection method of the VCSELs 72 in the laser block 74 according to this illustrative embodiment is described. Meanwhile, in order to clarify the descriptions of the connection method of the VCSELs 72, it is assumed that connection points B1, B2, B3, B4 of four wires are provided in the longitudinal direction of the power supplying pad 82 and connection points B1', B2', B3', B4' of four wires are provided in the longitudinal direction of the power supplying pad 82'. Also, it is assumed that connection points W1, W2, W3, W4 of wires for connection to the power supplying pad 82 are provided and connection points W1', W2', W3', W4' of wires for connection to the power supplying pad 82' are provided in the longitudinal direction of the power feeding pad 84.

Also, in order to make a wiring length of the wire as short as possible, the connection points W1, W2, W3, W4 are provided in an upper half region of the power supplying pad 84 in the sheet width direction of FIG. 9, and the connection points W1', W2', W3', W4' are provided in a lower half region of the power supplying pad 84 in the sheet width direction of FIG. 9.

Also, the number of wires for connecting the adjacent VCSELs 72 is changed depending on a relation between current flowing through the VCSEL 72 and allowable current enabled to flow through one wire. Therefore, the power supplying pad 82 and the power supplying pad 84, and the power supplying pad 82' and the power supplying pad 84 can be connected to each other by one wire, respectively. However, in order to feed the power to the VCSEL 72 through a wire having a diameter of 25 μm, which is normally used, it is necessary to connect the power supplying, pads by a plurality of wires. Therefore, FIG. 9 illustrates an example where the power supplying pad 82 and the power supplying pad 84, and the power supplying pad 82' and the power supplying pad 84 are connected by a plurality of wires, respectively.

In this case, the connection point B1 of the connection points B1, B2, B3, B4 of the upstream-side VCSEL 72, which is closer to the downstream-side VCSEL 72, is connected to the connection point W1 of the connection points W1, W2, W3, W4 of the downstream-side VCSEL 72, which is closer to a center of the downstream-side VCSEL 72 in the sheet width direction, by the wire.

Then, the connection point B2 of the connection points B2, B3, B4 of the upstream-side VCSEL 72, which is closer to the downstream-side VCSEL 72, is connected to the connection point W2 of the connection points W2, W3, W4 of the downstream-side VCSEL 72, which is closer to the center of the downstream-side VCSEL 72 in the sheet width direction, by the wire.

Then, the connection point B3 of the connection points B3, B4 of the upstream-side VCSEL 72, which is closer to the downstream-side VCSEL 72, is connected to the connection point W3 of the connection points W3, W4 of the downstream-side VCSEL 72, which is closet to the center of the downstream-side VCSEL 72 in the sheet width direction, by the wire.

Then, the connection point B4 of the power supplying pad 82 of the upstream-side VCSEL 72 is connected to the connection point W4 of the power supplying pad 84 of the downstream-side VCSEL 72 by the wire.

In the meantime, the power supplying pad 82' of the upstream-side VCSEL 72 and the power supplying pad 84 of the downstream-side VCSEL 72 are connected in accordance with the same connection method as the connection method of the power supplying pad 82 and the power supplying pad 84. That is, the connection point B1' and the connection point W1', the connection point B2' and the connection point W2', the connection point B3' and the connection point W3' and the connection point B4' and the connection point W4' are connected by the wires, respectively.

In this way, the power supplying pad 82 of the upstream-side VCSEL 72 and the power supplying pad 84 of the downstream-side VCSEL 72, and the power supplying pad 82' of the upstream-side VCSEL 72 and the power supplying pad 84 of the downstream-side VCSEL 72 are connected, so that an overall shape of the wires connecting the power supplying pad 82 and the power supplying pad 84 and an overall, shape of the wires connecting the power supplying pad 82' and the power supplying pad 84 are substantially triangular, as seen towards the laser illumination surface of the VCSEL 72, and the plurality of VCSELs 72 is connected in series while the wires do not pass over the laser illumination range R of each VCSEL 72.

Meanwhile, in the example of FIG. 9, if the connection point B4 of the connection points B1, B2, B3, B4 of the power supplying pad 82 of the upstream-side VCSEL 72, which is most distant from the downstream-side VCSEL 72, and the connection point W1 of the downstream-side VCSEL 72 are connected by the wire, it is clear that the wire connecting the connection point B4 and the connection point W1 passes over the laser illumination range R of the upstream-side VCSEL 72 to interrupt the illumination of the laser.

Also, regarding a sequence of connecting the connection points of the VCSELs 72 by using a bonding wire apparatus, it is preferably to connect the connection points B1, B2, B3, B4 of the power supplying pad 82 of the upstream-side VCSEL 72 in descending order from the connection point which is closer to the downstream-side VCSEL 72. That is, it is preferably to connect the connection points by the bonding wire apparatus in order of the connection point B1 of the upstream-side VCSEL 72 and the connection point W1 of the downstream-side VCSEL 72, the connection point B2 of the upstream-side VCSEL 72 and the connection point W2 of the downstream-side VCSEL 72, the connection point B3 of the upstream-side VCSEL 72 and the connection point W3 of the downstream-side VCSEL 72 and the connection point B4 of the upstream-side VCSEL 72 and the connection point W4 of the downstream-side VCSEL 72.

Also for the power supplying pad 82' of the upstream-side VCSEL 72 and the power supplying pad 84 of the downstream-side VCSEL 72, it is preferably to connect the connection points by the bonding wire apparatus in order of the connection point B1' of the upstream-side VCSEL 72 and the connection point W1 of the downstream-side VCSEL 72, the connection point B2' of the upstream-side VCSEL 72 and the connection point W2' of the downstream-side VCSEL 72, the connection point B3' of the upstream-side VCSEL 72 and the connection point W3' of the downstream-side VCSEL 72 and the connection point B4' of the upstream-side VCSEL 72 and the connection point W4' of the downstream-side VCSEL 72.

The reason is described. If the power supplying pad 82 of the upstream-side VCSEL 72 and the power supplying pad 84 of the downstream-side VCSEL 72 are connected in reverse order to the above-described connection order, the connection point B4 of the upstream-side VCSEL 72 and the connection point W4 of the downstream-side VCSEL 72 are first connected. When a connected state of the connection point B4 of the upstream-side VCSEL 72 and the connection point W4 of the downstream-side VCSEL 72 is seen towards the laser illumination surface, of the VCSEL 72, the wire connecting the connection point B4 and the connection point W4 is connected with striding over the connection points B1, B2, B3 of the power supplying pad 82 of the upstream-side VCSEL 72.

Therefore, when it is intended to connect the connection point B1 of the upstream-side VCSEL 72 and the connection point W1 of the downstream-side VCSEL 72, the connection point B2 of the upstream-side VCSEL 72 and the connection point W2 of the downstream-side VCSEL 72, and the connection point B3 of the upstream-side VCSEL 72 and the connection point, W3 of the downstream-side VCSEL 72 by the bonding wire apparatus after connecting the connection point B4 of the upstream-side VCSEL 72 and the connection point W4 of the downstream-side VCSEL 72 by the wire, the wire connecting the connection point B4 of the upstream-side VCSEL 72 and the connection point W4 of the downstream-side VCSEL 72 becomes an obstacle. Therefore, the productivity of the laser drying device 70 may be lowered, as compared to the configuration where the connection point B1 of the upstream-side VCSEL 72 and the connection point W1 of the downstream-side VCSEL 72 are first connected.

Also, when connecting the power supplying pad 82 of the upstream-side VCSEL 72 and the power supplying pad 84 of the downstream-side VCSEL 72 and the power supplying pad 82' of the upstream-side VCSEL 72 and the power supplying pad 84 of the downstream-side VCSEL 72 by the wires, respectively, the wires are connected from the power supplying pad 84 of the downstream-side VCSEL 72 towards the power supplying pad 82 of the upstream-side VCSEL 72 and the power supplying pad 82' of the upstream-side VCSEL 72.

FIG. 10 pictorially illustrates an example where the laser block 74 of the laser drying device 70, which is obtained when the wires are connected from the power supplying pad 84 of the downstream-side VCSEL 72 towards the power supplying pad 82 of the upstream-side VCSEL 72, is seen in a Y direction of FIG. 9.

In general, the bonding wire apparatus is configured to connect a wire to one connection point of two connection points, to which the wire is first connected, to pull up the wire in a height direction of the VCSEL 72 and then to gently connect the wire to the other connection point. Therefore, a height of the wire from a connection point above the connection point is lowered at the other connection point, which is an ending point of the connection, as compared to the one connection point, which is a starting point of the connection.

Therefore, as shown in FIG. 10, a height of the wire above the surface electrode 81 of the upstream-side VCSEL 72 is suppressed to a height HA.

On the other hand, FIG. 11 pictorially illustrates an example where the laser block 74 of the laser drying device 70, which is obtained when the wires are connected from the power supplying pad 82 of the upstream-side VCSEL 72 towards the power supplying pad 84 of the downstream-side VCSEL 72, is seen in the Y direction of FIG. 9.

In this case, as shown in FIG. 11, the wire is pulled above the surface electrode 81 in the height direction of the upstream-side VCSEL 72 and is then connected to the back-side electrode 86 of the downstream-side VCSEL 72. Therefore, a height HB of the wire above the surface electrode 81 of the upstream-side VCSEL 72 is greater than the height HA.

As the height of the wire above the surface electrode 81 is lowered, a probability that the wire will interrupt the illumination of the laser is reduced. Therefore, in order to reduce non-uniformity in the illumination of the laser to the continuous sheet P by the VCSEL 72, it is preferably to lower the height of the wire above the surface electrode 81 as much as possible.

Therefore, when connecting the power supplying pad 82 of the upstream-side VCSEL 72 and the power supplying pad 84 of the downstream-side VCSEL 72 and the power supplying pad 82' of the upstream-side VCSEL 72 and the power supplying pad 84 of the downstream-side VCSEL 72 with the wires by using the bonding wire apparatus, respectively, the height of the wire above the surface electrode 81 in the height direction of the VCSEL 72 is suppressed lower if the wires are connected from the power supplying pad 84 of the downstream-side VCSEL 72 towards the power supplying pad 82 of the upstream-side VCSEL 72 and the power supplying pad 82' of the upstream-side VCSEL 72, as compared to the connection in reverse direction thereto. Thereby, it is possible to expect an effect of reducing the non-uniformity in the illumination of the laser to the continuous sheet P by the VCSEL 72.

Like this, the laser drying device 70 of this illustrative embodiment has the plurality of laser blocks 74 where the VCSEL 72 is first arranged so that the longitudinal direction of the power supplying pads 82, 82' of the VCSEL 72 is the sheet feeding direction, then the plurality of VCSELs 72 is arranged in a line in the sheet feeding direction and the power supplying pad 82 and power supplying pad 82 of the upstream-side VCSEL 72 and the power supplying pad 84 of the downstream-side VCSEL 72 are connected by the wires.

In this case, since the light intensity of the laser in the laser illumination range of each laser block 74 falls in the predetermined range within which the light intensity of the laser can be regarded as uniform, it is possible to expect an effect of reducing the non-uniformity in the illumination of the laser illuminated from the laser drying device 70 to the continuous sheet P.

Although the present invention has been described with reference to the illustrative embodiment, the technical scope of the present invention is not limited to the illustrative embodiment. The illustrative embodiment can be variously changed or improved without departing from the gist of the present invention and the changes and modifications are also included in the technical scope of the present invention.

Figure 12:
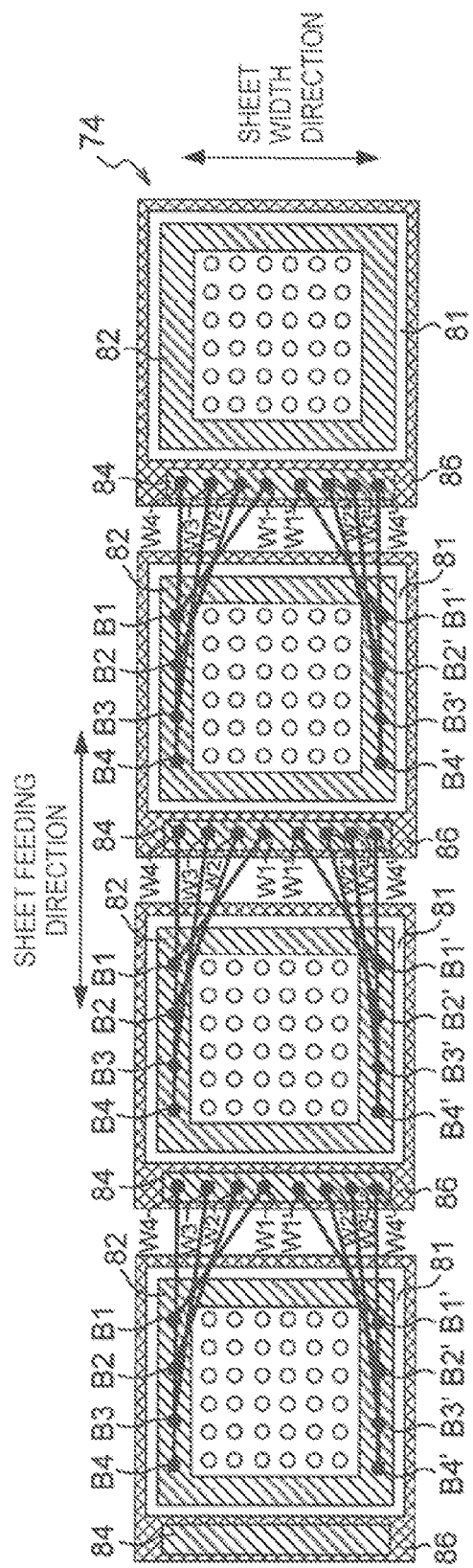
FIG. 12 illustrates a connection example when a four-side power supplying type VCSEL is connected.

For example, as shown in FIG. 8, according to the laser drying device 70 of the illustrative embodiment, the VCSEL 72 in which the power supplying pads 82, 82' are respectively provided at both opposite ends of the surface electrode 81 is used. However, as shown in FIG. 12, a four-side power supplying type VCSEL in which the power supplying pad 82 is provided over a periphery of the surface electrode 81 may also be used.

In this case, like the VCSEL 72 shown in FIG. 9, the connection points B1, B2, B3, B4 and the connection points B1', B2', B3', B4' are arranged at both ends of the power supplying pad 82, which is provided over the periphery of the surface electrode 81, in the sheet width direction.

The reason is described. If the connection points are arranged at both ends of the power supplying pad 82, which is provided over the periphery of the surface electrode 81, in the sheet feeding direction, the wires connecting the power supplying pad 82 of the upstream-side four-side power supplying type VCSEL and the power supplying pad 84 of the downstream-side four-side power supplying type VCSEL pass over the laser illumination surface of the upstream-side four-side power supplying type VCSEL.

In the meantime, the connection order and connection direction of the wires when connecting a plurality of four-side power supplying type VCSELs are preferably the same as the connection order and connection direction of the wires in the both-side power supplying type VCSEL 72.

Also, according to the illustrative embodiment, the continuous sheet P is used as the recording medium. However, the type of the recording medium is not limited thereto. For example, a cut sheet such as A4 and A4 may also be used. Also, the material of the recording medium is not limited to the sheet. For example, any material to which the ink droplets are fixed by the laser drying device 70 may also be used.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A drying device comprising a plurality of surface-emitting laser elements each having a plurality of laser elements and arranged along a feeding direction of a recording medium,
    wherein each of the surface-emitting laser elements has electrodes arranged on a laser illumination surface and a backside which is an opposite surface of the laser illumination surface, respectively,
    wherein first power supplying pads are respectively provided at both ends of the electrode on the laser illumination surface in a width direction of the recording medium intersecting with the feeding direction of the recording medium and a second power supplying pad is provided at one end of the electrode on the backside in the feeding direction of the recording medium, and
    wherein the respective first power supplying pads of the surface-emitting laser element arranged at an upstream-side with respect to the feeding direction of the recording medium and the second power supplying pad of the surface-emitting laser element arranged at a downstream-side with respect to the feeding direction of the recording medium are connected to each other by wires.

2. The drying device according to claim 1, wherein the respective first power supplying pads and the second power supplying pad are connected to each other by the wires so that laser illuminated from the laser illumination surface is not interrupted.

3. The drying device according to claim 2,
    wherein each of the first power supplying pads has a shape of which a longitudinal direction is the feeding direction of the recording medium and is provided with a plurality of connection points of the wires, and the second power supplying pad has a shape of which a longitudinal direction is the width direction of the recording medium and is provided with a plurality of connection points of the wires, and
    wherein a connection point of the plurality of connection points provided in each said first power supplying pad of the surface-emitting laser element which is arranged at the upstream-side with respect to the feeding direction of the recording medium, which the connection point is closer to the surface-emitting laser element which is arranged at the downstream-side with respect to the feeding direction of the recording medium, and a connection point of the plurality of connection points provided in the second power supplying pad of the surface-emitting laser element which is arranged at the downstream-side with respect to the feeding direction of the recording medium, which the connection point is closer to a center of the surface-emitting laser element which is arranged at the downstream-side with respect to the feeding direction of the recording medium in the width direction of the recording medium, are connected to each other by one of the wires.

4. The drying device according to claim 3, wherein the connection point of the plurality of connection points provided in each said first power supplying pad of the surface-emitting laser element which is arranged at the upstream-side with respect to the feeding direction of the recording medium, which the connection point is closer to the surface-emitting laser element which is arranged at the downstream-side with respect to the feeding direction of the recording medium, is first connected to the connection point of the plurality of connection points provided in the second power supplying pad of the surface-emitting laser element which is arranged at the downstream-side with respect to the feeding direction of the recording medium, which the connection point is closer to the center of the surface-emitting laser element which is arranged at the downstream-side with respect to the feeding direction of the recording medium in the width direction of the recording medium, by the one of the wires and then the other connection points provided in the first power supplying pad are connected to the other connection points provided in the second power supplying pad in descending order by the other of the wires, respectively.

5. The drying device according to claim 1, wherein the wires are connected from the second power supplying pad of the surface-emitting laser element arranged at the downstream-side with respect to the feeding direction of the recording medium towards the first power supplying pads of the surface-emitting laser element arranged at the upstream-side with respect to the feeding direction of the recording medium.

6. An image forming apparatus comprising:
an ejector configured to eject droplets to a recording medium in accordance with an image;
a conveyer configured to convey the recording medium;
the drying device according to claim 1; and
a controller configured to control the ejector, the conveyer and the drying device.

* * * * *